US010554145B2

(12) United States Patent
Hirasawa et al.

(10) Patent No.: US 10,554,145 B2
(45) Date of Patent: Feb. 4, 2020

(54) ELECTRICAL POWER CONVERSION APPARATUS

(71) Applicant: DENSO CORPORATION, Kariya, Aichi-pref. (JP)

(72) Inventors: Naoki Hirasawa, Nisshin (JP); Ryota Tanabe, Kariya (JP); Taijiro Momose, Kariya (JP)

(73) Assignee: DENSO CORPORATION, Kariya (JP)

( * ) Notice: Subject to any disclaimer, the term of this patent is extended or adjusted under 35 U.S.C. 154(b) by 66 days.

(21) Appl. No.: 15/990,954

(22) Filed: May 29, 2018

(65) Prior Publication Data

US 2018/0342959 A1 Nov. 29, 2018

(30) Foreign Application Priority Data

May 29, 2017 (JP) .................................. 2017-105891

(51) Int. Cl.
*H02M 7/00* (2006.01)
*H02M 7/537* (2006.01)
(Continued)

(52) U.S. Cl.
CPC ............ *H02M 7/003* (2013.01); *H01G 4/228* (2013.01); *H01G 4/38* (2013.01); *H01G 4/40* (2013.01);
(Continued)

(58) Field of Classification Search
CPC ...... H02M 7/003; H02M 7/217; H02M 7/219; H02M 7/537; H02M 7/5387; H02M 3/155–3/1588; H02M 2001/007; H01G 4/228; H01G 4/38; H01G 4/385; H01G 4/40; H01L 23/645; H01L 29/7393;
(Continued)

(56) References Cited

U.S. PATENT DOCUMENTS

2014/0119087 A1* 5/2014 Matsuoka ............. H02M 7/003
363/132
2016/0128216 A1* 5/2016 Harada ................ H05K 7/1432
361/728

FOREIGN PATENT DOCUMENTS

JP 2014-064407 A 4/2014
JP 2017-017999 A 1/2017

* cited by examiner

*Primary Examiner* — Gary L Laxton
*Assistant Examiner* — Ivan Laboy
(74) *Attorney, Agent, or Firm* — Oliff PLC (57) ABSTRACT

An electrical power conversion apparatus includes a high-voltage bus bar, a low-voltage bus bar, and a relay bus bar which are integrated together in the form of a bus bar assembly. The high-voltage bus bar includes semiconductor-side high-voltage terminals and capacitor-side high-voltage terminals. The low-voltage bus bar includes semiconductor-side low-voltage terminals and capacitor-side low-voltage terminals. The relay bus bar includes a reactor-side relay terminal and a capacitor-side relay terminal 532. The capacitor-side high-voltage terminals, the capacitor-side low-voltage terminals, and the capacitor-side relay terminal are arranged in the form of a terminal array. The capacitor-side high-voltage terminals and the capacitor-side low-voltage terminals are arranged adjacent each other. The capacitor-side relay terminal is located at an end of an array of the capacitor-side high-voltage terminals and the capacitor-side low-voltage terminals. With these arrangements, the electrical power conversion apparatus is capable of reducing the inductance and facilitating the assembling and downsizing thereof.

11 Claims, 9 Drawing Sheets

(51) Int. Cl.
*H02M 3/158* (2006.01)
*H02B 1/20* (2006.01)
*H01G 4/228* (2006.01)
*H01G 4/38* (2006.01)
*H02G 5/00* (2006.01)
*H01G 4/40* (2006.01)
*H01L 23/64* (2006.01)
*H01L 29/739* (2006.01)

(52) U.S. Cl.
CPC ........ *H01L 23/645* (2013.01); *H01L 29/7393* (2013.01); *H02B 1/20* (2013.01); *H02G 5/005* (2013.01); *H02M 7/537* (2013.01); *B60L 2210/40* (2013.01)

(58) Field of Classification Search
CPC ... H02B 1/20; H02B 1/21; H02G 5/00; H02G 5/002; H02G 5/005; H02G 5/007; B60L 2210/40
USPC .................................................. 363/146, 147
See application file for complete search history.

FIG.10

ELECTRICAL POWER CONVERSION APPARATUS

CROSS REFERENCE TO RELATED DOCUMENT

The present application claims the benefit of priority of Japanese Patent Application No. 2017-105891 filed on May 29, 2017, the disclosure of which is incorporated herein by reference.

BACKGROUND

Technical Field

This disclosure relates generally to an electrical power conversion apparatus.

Background Art

Japanese Patent First Publication No. 2014-64407 discloses an electrical power conversion device equipped with a pair of bus bars connecting a semiconductor module and a capacitor. The bus bars are partially sealed by a potting material in a capacitor unit, so that they are integrated together in the form of a single assembly.

The above publication is, however, silent about a reactor and a connection between the reactor and the capacitor.

There are power conversion devices which are mounted in electrical vehicles or hybrid vehicles and designed to step-up a dc electrical power at a dc power supply and then convert it into an ac electrical power. Specifically, the power conversion devices are equipped with a step-up transformer which usually has a reactor installed therein.

It is, therefore, necessary for the above structure to have a bus bar to electrically connect the reactor and the capacitor together. Specifically, the power conversion device are equipped with two bus bars connecting between the capacitor and the semiconductor module and a bus bar connecting between the reactor and the capacitor. It is necessary to electrically isolate the bus bars from each other within the electrical power conversion device and also to minimize the inductance of the bus bars. It is also required to improve the ease with which the bus bars are arranged inside the electrical power conversion device and reduce the size of the electrical power conversion device.

SUMMARY

It is therefore an object of this disclosure to provide an electrical power conversion apparatus which is designed to enhance a reduction in the inductance, facilitate the assembling thereof, and enables to be reduced in size thereof.

According to one aspect of this disclosure, there is provided an electrical power conversion apparatus which comprises: (a) a semiconductor module in which semiconductor devices are installed; (b) a smoothing capacitor, a filter capacitor, and a reactor which are electrically connected to the semiconductor modules; (c) a high-voltage bus bar which connects the semiconductor module and a high-voltage electrode of the smoothing capacitor; (d) a low-voltage bus bar which connects the semiconductor module and a low-voltage electrode of the smoothing capacitor; and (e) a relay bus bar which connects the filter capacitor and the reactor.

The high-voltage bus bar, the low-voltage bus bar, and the relay bus bar are electrically isolated from each other and integrated together in a form of a bus bar assembly.

The high-voltage bus bar is equipped with a semiconductor-side high-voltage terminal connected to the semiconductor module and a capacitor-side high-voltage terminal connected to the smoothing capacitor.

The low-voltage bus bar is equipped with a semiconductor-side low-voltage terminal connected to the semiconductor module and a capacitor-side low-voltage terminal connected to the smoothing capacitor.

The relay bus bar is equipped with a reactor-side relay terminal connected to the reactor and a capacitor-side relay terminal connected to the filter capacitor.

The capacitor-side high-voltage terminal, the capacitor-side low-voltage terminal, and the capacitor-side relay terminal are aligned with each other in an array direction in a form of a terminal array.

The capacitor-side high-voltage terminal and the capacitor-side low-voltage terminal of the terminal array are arranged adjacent each other. The capacitor-side relay terminal is located at an end of the terminal array.

The electrical power conversion apparatus is, as described above, designed to have the high-voltage bus bar, the low-voltage bus bar, and the relay bus bar which are integrated together in the form of the bus bar assembly. This enables the high-voltage bus bar, the low-voltage bus bar, and the relay bus bar to be handled as a single unit in an assembling process of the electrical power conversion apparatus, thereby facilitating the ease with which the electrical power conversion apparatus is fabricated.

Since the high-voltage bus bar, the low-voltage bus bar, and the relay bus bar are fabricated as the bus bar assembly, it is possible to ensure electrical insulation between the bus bars and also to place them close to each other. This facilitates the down-sizing of the electrical power conversion apparatus.

The capacitor-side high-voltage terminal and the capacitor-side low-voltage terminal of the terminal array are arranged adjacent each other. This decreases the inductance of electrical current paths in the high-voltage bus bar and the low-voltage bus bar. Specifically, electrical currents flow through the capacitor-side high-voltage terminal and the capacitor-side low-voltage terminal in opposite directions. The arrangement of the capacitor-side high-voltage terminal and the capacitor-side low-voltage terminal adjacent each other, thus, results in a decrease in inductance of the electrical current paths.

The electrical power conversion apparatus, is, as apparent from the above discussion, capable of reducing the inductance and facilitating the assembling and downsizing thereof.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings.

DESCRIPTION OF THE PREFERRED EMBODIMENTS

First Embodiment

Figure 1:
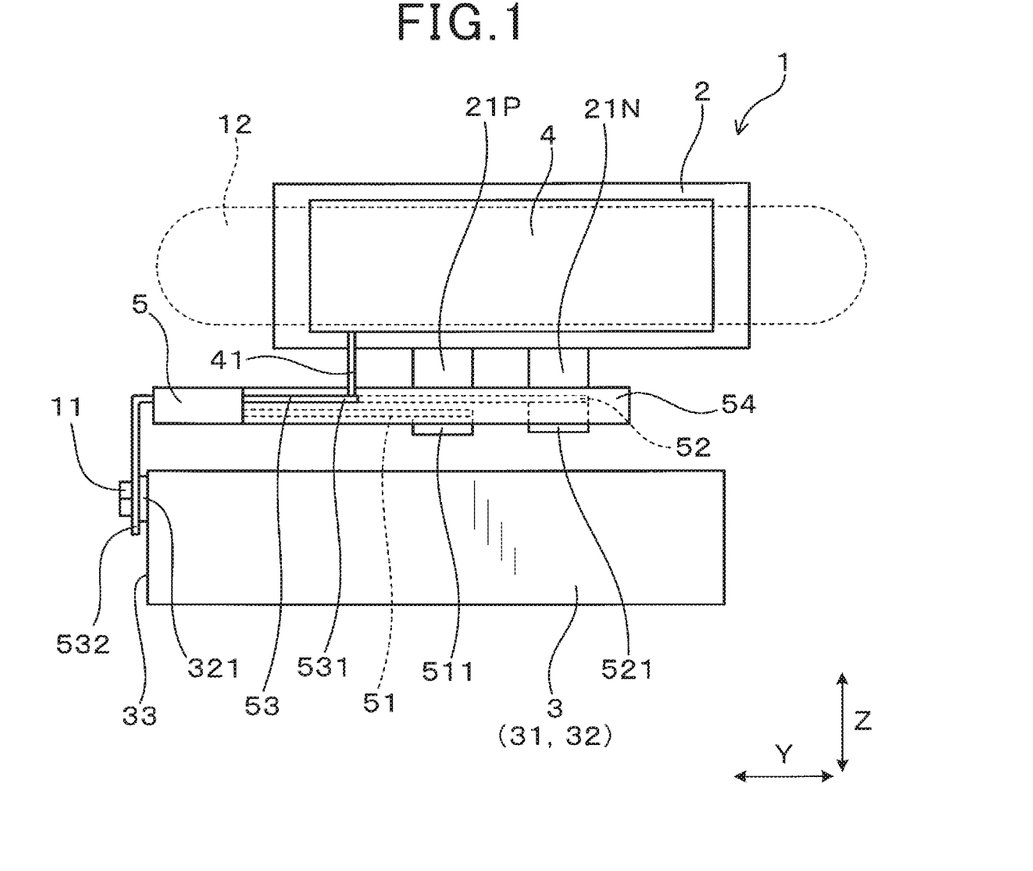
FIG. 1 is an explanatory view which illustrates a power conversion device according to the first embodiment.
Figure 2:
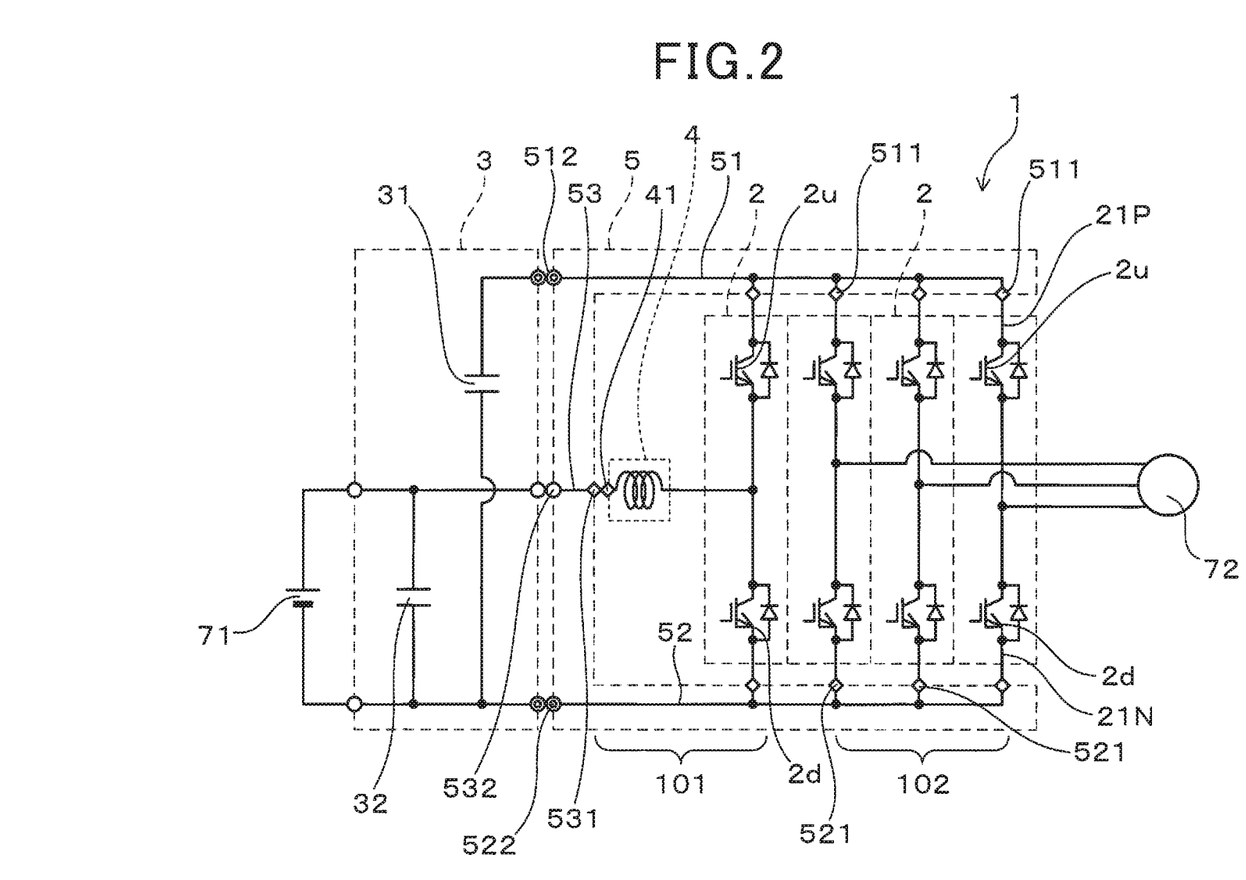
FIG. 2 is a circuit diagram of an electrical power conversion device in the first embodiment.

Referring now to the drawings, wherein like reference numbers will refer to like parts throughout the several views, particularly to FIGS. 1 to 9, there is shown the electrical power conversion device 1 according to the first embodiment. The electrical power conversion device 1 is, as illustrated in FIGS. 1 and 2, equipped with the semiconductor modules 2, the smoothing capacitor 31, the filter capacitor 32, the reactor 4, the high-voltage bus bar 51, the low-voltage bus bar 52, and the relay bus bar 53.

Each of the semiconductor modules 2 has the semiconductor devices 2u and 2d installed therein. The smoothing capacitor 31, the filter capacitor 32, and the reactor 4 are electrically connected to the semiconductor modules 2.

The high-voltage bus bar 51 is a bus bar which connects the semiconductor modules 2 and a high-voltage electrode of the smoothing capacitor 31. The low-voltage bus bar 52 is a bus bar which connects the semiconductor modules 2 and a low-voltage electrode of the smoothing capacitor 31. The relay bus bar 53 is a bus bar which connects the filter capacitor 32 and the reactor 4 together.

The high-voltage bus bar 51, the low-voltage bus bar 52, and the relay bus bar 53 are electrically isolated from each other by the insulator 54 in the form of a single unit. Specifically, the high-voltage bus bar 51, the low-voltage bus bar 52, and the relay bus bar 53 are fixed together by the insulator 54 in the form of the bus bar assembly 5 shown in FIG. 4.

Figure 3:
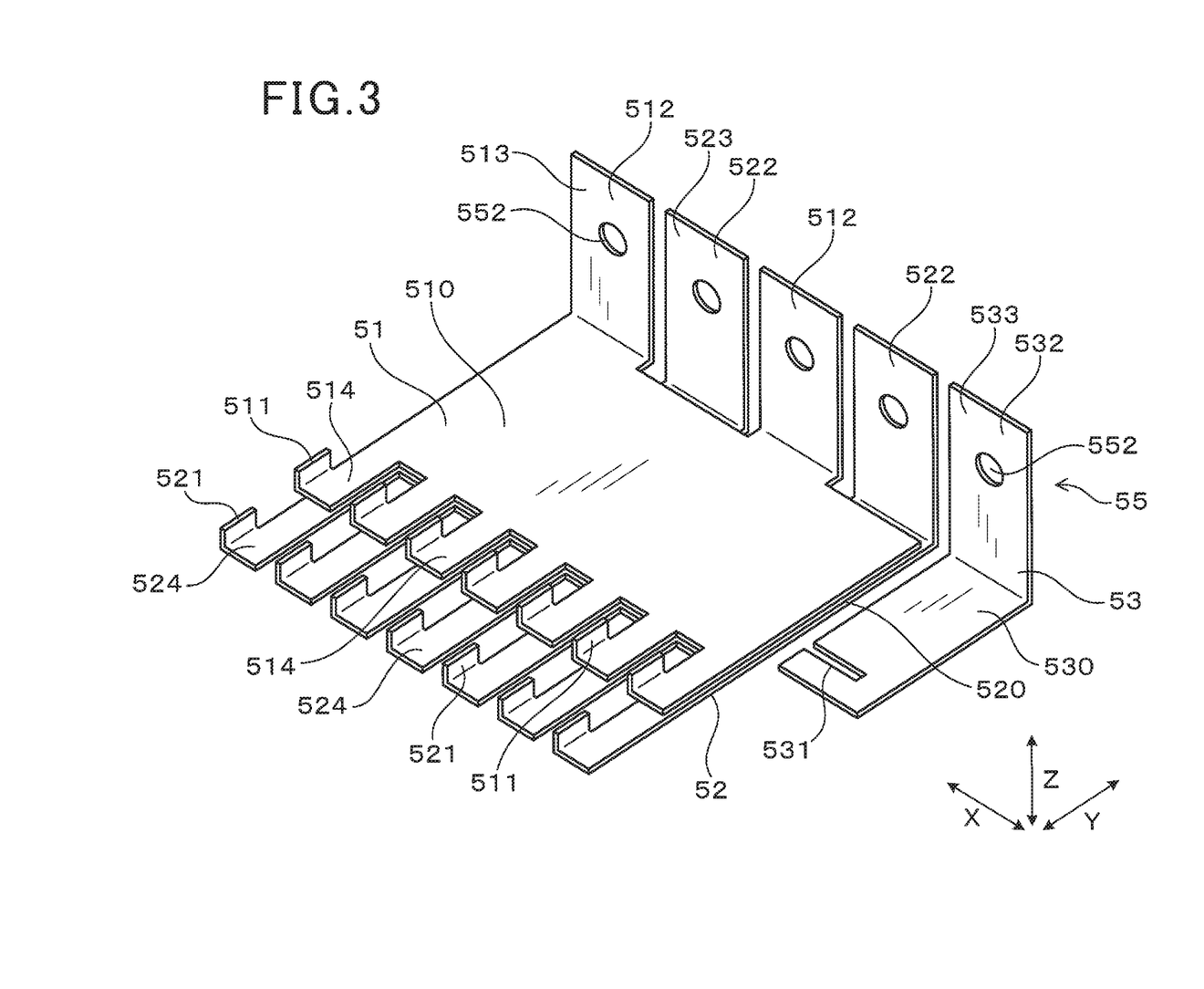
FIG. 3 is a perspective view which illustrates a high-voltage bus bar, a low-voltage bus bar, and the relay bus bar in the first embodiment.

The high-voltage bus bar 51, as clearly illustrated in FIG. 3, includes the semiconductor-side high-voltage terminals 511 connected to the semiconductor modules 2 and the capacitor-side high-voltage terminals 512 connected to the smoothing capacitor 31.

The low-voltage bus bar 52 includes the semiconductor-side low-voltage terminals 521 connected to the semiconductor modules 2 and the capacitor-side low-voltage terminals 522 connected to the smoothing capacitor 31.

The relay bus bar 53 includes the reactor-side relay terminal 531 connected to the reactor 4 and the capacitor-side relay terminal 532 connected to the filter capacitor 32.

The capacitor-side high-voltage terminals 512, the capacitor-side low-voltage terminals 522, and the capacitor-side relay terminal 532 are aligned with each other in a direction X (which will also be referred to as an array direction) in the form of the terminal array 55. Each of the capacitor-side high-voltage terminals 512 is arranged adjacent one of the capacitor-side low-voltage terminals 522. The capacitor-side relay terminal 532 is located at an end of the terminal array 55. The capacitor-side high-voltage terminals 512, the capacitor-side low-voltage terminals 522, and the capacitor-side relay terminal 532 have terminal contact surfaces 513, 523, and 533, respectively. The terminal contact surfaces 513, 523, and 533 face in the same direction. In this disclosure, the array direction X is oriented along the terminal contact surfaces 513, 523, and 533. In other words, the terminal contact surfaces 513, 523, and 533 lie flush with each other in the array direction X.

The high-voltage bus bar 51 includes a plurality of capacitor-side high-voltage terminals 512. The low-voltage bus bar 52 includes a plurality of capacitor-side low-voltage terminals 522. In the terminal array 55, the capacitor-side high-voltage terminals 512 and the capacitor-side low-voltage terminals 522 are, as clearly illustrated in FIG. 3, arranged alternately. The capacitor-side relay terminal 532 is located at the end of the terminal array 55 in the array direction X.

In the terminal array 55, the capacitor-side relay terminal 532 is arranged next to the capacitor-side low-voltage terminals 522.

In this embodiment, the high-voltage bus bar 51 includes a plurality of semiconductor-side high-voltage terminals 511. The low-voltage bus bar 52 includes a plurality of semiconductor-side high-voltage terminals 521.

The high-voltage bus bar 51 is equipped with the high-voltage body 510 disposed between the semiconductor-side high-voltage terminals 511 and the capacitor-side high-voltage terminals 512. The low-voltage bus bar 52 is equipped with the low-voltage body 520 disposed between the semiconductor-side low-voltage terminals 521 and the capacitor-side low-voltage terminals 522. The relay bus bar 53 is equipped with the relay body 530 disposed between the reactor-side relay terminal 531 and the capacitor-side relay terminal 532.

Each of the high-voltage body 510, the low-voltage body 520, and the relay body 530 has major surfaces. The major surfaces of the high-voltage body 510, the low-voltage body 520, and the relay body 530 are oriented to face in the same direction, that is, a major surface-of-body facing direction Z perpendicular to the major surfaces of the high-voltage body 510, the low-voltage body 520. The high-voltage body 510, the low-voltage body 520, and the relay body 530 are each formed in a flat-plate shape. The high-voltage body 510, the low-voltage body 520, and the relay body 530 are oriented in parallel to each other.

Normal lines of the terminal contact surfaces 513, 523, and 533 of the terminal array 55 are oriented in a direction traversing the major surface-of-body facing direction Z. Specifically, the normal lines of the terminal contact surfaces 513, 523, and 533 are directed perpendicular to the major surface-of-body facing direction Z. The term "perpendicular to", as referred to herein, does not mean "geometrically orthogonal to", in other words, "right angles (i.e., 90°) to", but may include "substantially perpendicular to" or "with slight inclination".

Figure 5:
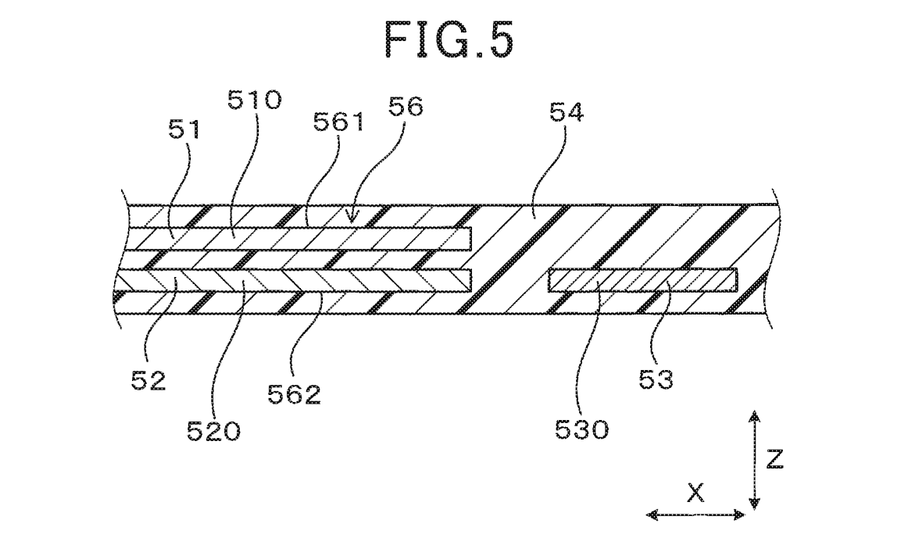
FIG. 5 is a sectional view, as taken along the line V-V in FIG. 4, which partially illustrates a bus bar assembly in the first embodiment.

The high-voltage body 510 and the low-voltage body 520 are, as clearly illustrated in FIG. 5, stacked on each other through an interval therebetween in the major surface-of-body facing direction Z to form the layer stack 56. The relay body 530 is located away from the layer stack 56 in the array direction X, that is, does not overlap the layer stack 56 in the major surface-of-body facing direction Z.

The relay body 530 is arranged between major surfaces 561 and 562 of the layer stack 56 which are opposed to each other in the major surface-of-body facing direction Z. The major surface 561 of the layer stack 56 is located on the opposite side of the high-voltage body 510 to the low-voltage body 520. The major surface 562 of the layer stack 56 is located on the opposite side of the low-voltage body 520 to the high-voltage body 510.

The relay body 530 may be at least partially disposed between extended lines of the major surfaces 561 and 562 of the layer stack 56 in the major surface-of-body facing direction Z. In other words, the relay body 530 may be at least partially aligned in the stack direction X with between the major surfaces 561 and 562 of the layer stack 56 which are opposed to each other in the major surface-of-body facing direction Z. It is advisable in this embodiment that the relay body 530 be fully disposed inside between the extended lines of the major surfaces 561 and 562 of the layer stack 56 in the major surface-of-body facing direction Z. In this embodiment, the relay body 530 lies flush with the low-voltage body 520.

Figure 6:
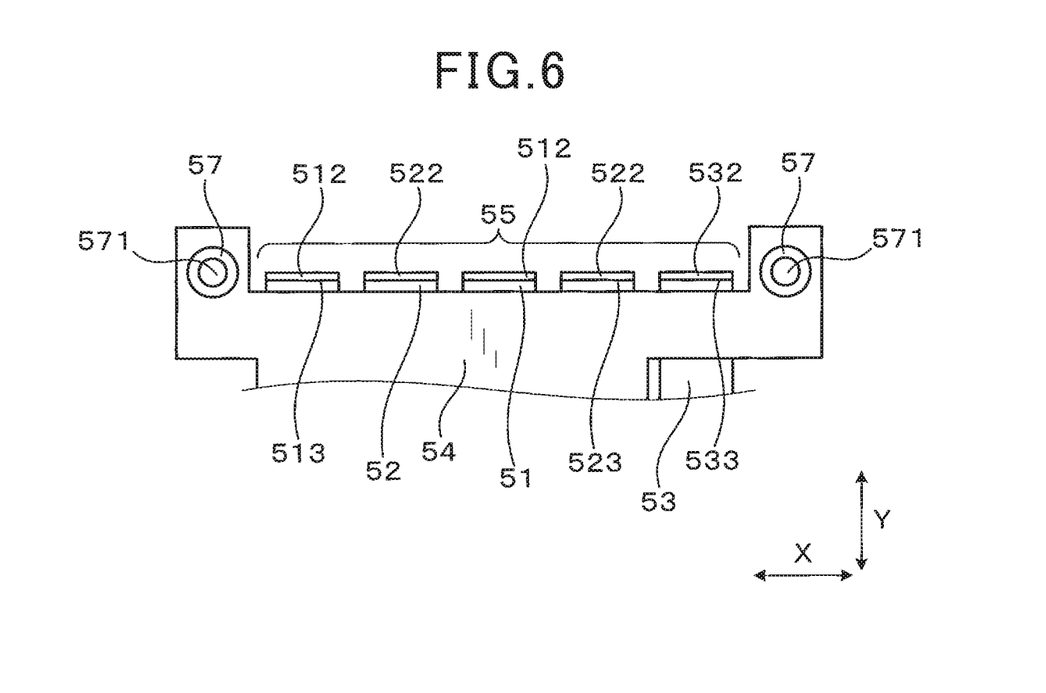
FIG. 6 is a plan view which illustrate a portion of a bus bar assembly including a terminal array in the first embodiment.

When viewed in a direction perpendicular both to the normal direction of the terminal contact surfaces 513, 523, and 533 of the terminal array 55 and to the array direction X in FIG. 6, the capacitor-side high-voltage terminals 512, the capacitor-side low-voltage terminals 522, and the capacitor-side relay terminal 532 are aligned with each other in the array direction X. In this embodiment, the normal direction of the terminal contact surface 513 is a direction perpendicular both to the major surface-of-body facing direction Z and to the array direction X. The direction perpendicular to the normal direction of the terminal contact surface 513 and the array direction X, therefore, coincides with the major surface-of-body facing direction Z. When viewed in the major surface-of-body facing direction Z, the capacitor-side high-voltage terminals 512, the capacitor-side low-voltage terminals 522, and the capacitor-side relay terminal 532 are, thus, arranged in line in the array direction X.

In the terminal array 55, the terminal contact surfaces 513 of the capacitor-side high-voltage terminals 512, the terminal contact surfaces 523 of the capacitor-side low-voltage terminals 522, and the terminal contact surface 533 of the capacitor-side relay terminal 532 lie flush with each other.

In the following discussion, the direction perpendicular both to the array direction X and to the major surface-of-body facing direction Z will also be referred to as a longitudinal direction Y.

Figure 7:
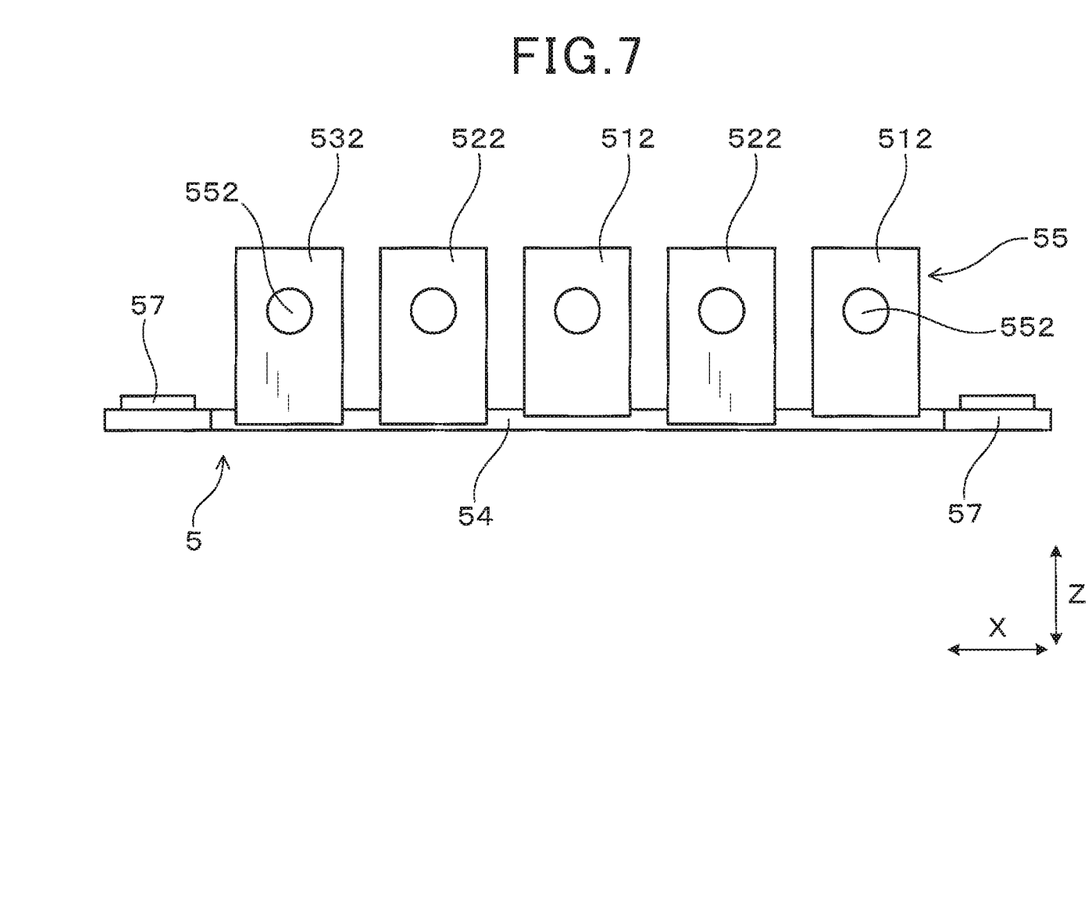
FIG. 7 is a rear view which illustrates a bus bar assembly in the first embodiment.

When viewed in the longitudinal direction Y in FIG. 7, the capacitor-side high-voltage terminals 512, the capacitor-side low-voltage terminals 522, and the capacitor-side relay terminal 532 are aligned with each other in the array direction X.

Figure 4:
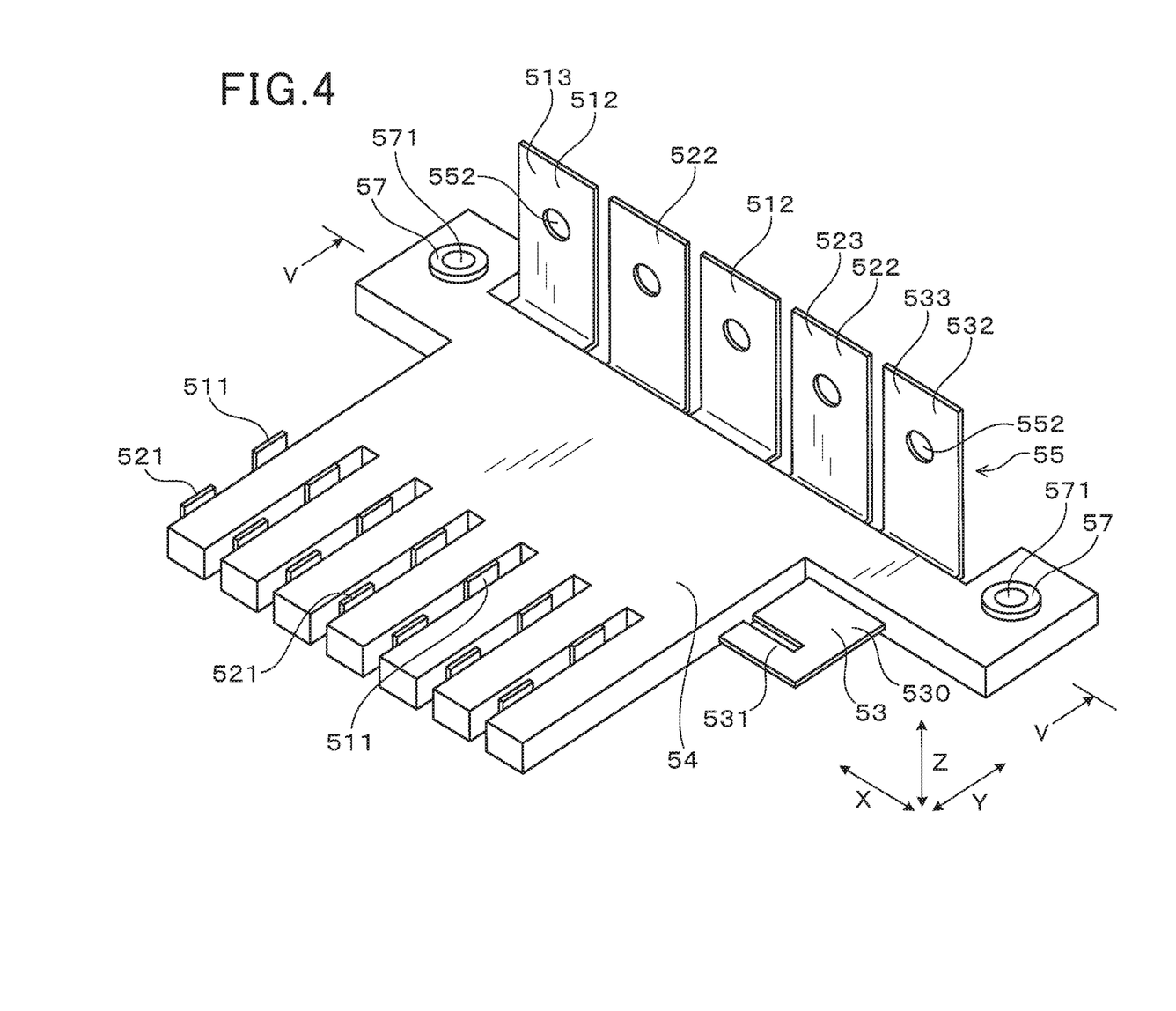
FIG. 4 is a perspective view which illustrates a bus bar assembly in the first embodiment.

The bus bar assembly 5, as illustrated in FIGS. 4, 6, and 7, includes at least two attachment portions 57 secured to a casing (not shown) of the electrical power conversion device 1. The attachment portions 57 are disposed on opposite sides of the terminal array 55 in the array direction X. Each of the attachment portions 57 has formed therein the bolt hole 571 through which a bolt (not shown) passes. The bolt hole 571 is a hole extending through a portion of thickness of the insulator 54 of the bus bar assembly 5 in the major surface-of-body facing direction Z. The securement of the bus bar assembly 5 to the casing is achieved by inserting the bolts into the bolt holes 571 of the attachment portions 57 and fastening them to the casing.

The high-voltage bus bar 51, as illustrated in FIG. 3, has the capacitor-side high-voltage terminals 512 located at one of ends of the high-voltage body 510 opposed to each other in the longitudinal direction Y. The high-voltage bus bar 51 also has the semiconductor-side high-voltage terminals 511 located on the other end of the high-voltage body 510. In the following discussion, the end of the high-voltage body 510 on which the capacitor-side high-voltage terminals 512 are arranged will also be referred to as a rear side, while the end of the high-voltage body 510 opposite the rear side will also be referred to as a front side. The high-voltage body 510 has a plurality of teeth 514 which are arranged in a pectinate or comb-like shape on the front side. The high-voltage body 510 has portions which extend from side edges of the teeth 514 in the major surface-of-body facing direction Z and define the semiconductor-side high-voltage terminals 511.

The low-voltage bus bar 52 has the capacitor-side low-voltage terminals 522 disposed on the rear side of the low-voltage body 520 and also has the semiconductor-side high-voltage terminals 521 disposed on the front side of the low-voltage body 520. The low-voltage body 520 has a plurality of teeth 524 disposed on the front side thereof. The low-voltage body 520 has portions which extend from side edges of the teeth 524 in the major surface-of-body facing direction Z and define the semiconductor-side low-voltage terminals 521.

The high-voltage body 510 and the low-voltage body 520 of the bus bar assembly 5 are, as illustrated in FIGS. 3 and 4, substantially fully sealed by the insulator 54. The insulator 54 may be made of insulating resin material. The semiconductor-side high-voltage terminals 511 and the semiconductor-side low-voltage terminals 521 are exposed outside the insulator 54. Similarly, the capacitor-side high-voltage terminals 512 and the capacitor-side low-voltage terminals 522 are exposed outside the insulator 54.

The relay bus bar 53 has the reactor-side relay terminal 531 and the capacitor-side relay terminal 532 exposed outside the insulator 54. The relay body 530 is partially sealed by the insulator 54.

The electrical power conversion device 1 is, as illustrated in FIG. 2, designed to perform electrical power conversion between the dc power supply 71 and the three-phase electrical rotating machine 72. The electrical power conversion device 1 is equipped with the step-up transformer 101 and the inverter 102. The step-up transformer 101 is made up of the reactor 4 and the semiconductor devices $2u$ and $2d$. The inverter 102 is made up of the semiconductor modules $2u$ and $2d$.

The filter capacitor 32 is connected in parallel to the dc power supply 71. The reactor 4 has the terminal 41 electrically connected to the terminal of the filter capacitor 32 which is connected to the positive electrode of the dc power supply 71. The terminal 41 is connected to the reactor-side relay terminal 531 of the relay bus bar 53. The other terminal of the reactor 4 is connected to a joint of the two semiconductor devices $2u$ and $2d$ which are connected in series with each other. The semiconductor devices $2u$ and $2d$ to which the reactor 4 is connected constitute the step-up transformer 101 together with the reactor 4. The upper arm semiconductor devices $2u$ are connected to the high-voltage bus bar 51. The lower arm semiconductor devices 2d are connected to the low-voltage bus bar 52.

The smoothing capacitor 31 is connected between the high-voltage bus bar 51 and the low-voltage bus bar 52. The inverter 102 is equipped with legs for three phases each of which is made up of the upper arm semiconductor device 2u and the lower arm semiconductor device 2d which are connected in series. The legs are connected in parallel to each other between the high-voltage bus bar 51 and the low-voltage bus bar 52.

The switching devices 2u and 2d of each of the semiconductor modules 2 are made of an IGBT (Insulated Gate Bipolar Transistor). Each of the upper arm switching devices 2u and the lower arm switching devices 2d has a flywheeling diode connected in inverse-parallel thereto. A joint between each of the upper arm switching devices 2u and one of the lower arm switching devices 2d is connected to one of electrodes of the electrical rotating machine 72. The switching devices 2u and 2d may alternatively be implemented by a MOSFET (i.e., metal-oxide-semiconductor field-effect transistor).

The electrical power conversion device 1 works to convert the dc power into three-phase ac power to drive the electrical rotating machine 72. The electrical power, as produced by the electrical rotating machine 72, may be changed by the inverter 102 into direct current in a regenerative mode.

The semiconductor devices 2u and 2d are installed in each of the semiconductor modules 2. Each of the semiconductor modules 2 may be engineered to have a single or a plurality of semiconductor devices mounted therein. For instance, each of the semiconductor modules 2 may be designed to have a series-connected assembly of the upper arm semiconductor device 2u and the lower arm semiconductor device 2d disposed therein or have a plurality of upper arm semiconductor devices 2u connected in parallel to each other and a plurality of lower arm semiconductor devices 2d connected in parallel to each other.

This disclosure refers to the semiconductor modules 2 each of which has installed therein an assembly of the upper arm semiconductor device 2u and the lower arm semiconductor device 2d which are connected together in series. Each of the semiconductor modules 2 is equipped with the positive terminal 21P connected to the collector of the upper arm semiconductor device 2u and the negative terminal 21N connected to the emitter of the lower arm semiconductor device 2d.

The positive terminals 21P are, as illustrated in FIGS. 1 and 2, connected to the semiconductor-side high-voltage terminals 511 of the high-voltage bus bar 51. The negative terminals 21N are connected to the semiconductor-side low-voltage terminals 521 of the low-voltage bus bar 5.

The positive terminals 21P and the semiconductor-side high-voltage terminals 511 may be welded or brazed together. Similarly, the negative terminals 21N and the semiconductor-side low-voltage terminals 521 may be welded or brazed together. The reactor-side relay terminal 531 of the relay bus bar 53 and the reactor 4 may also be welded or brazed together.

Figure 8:
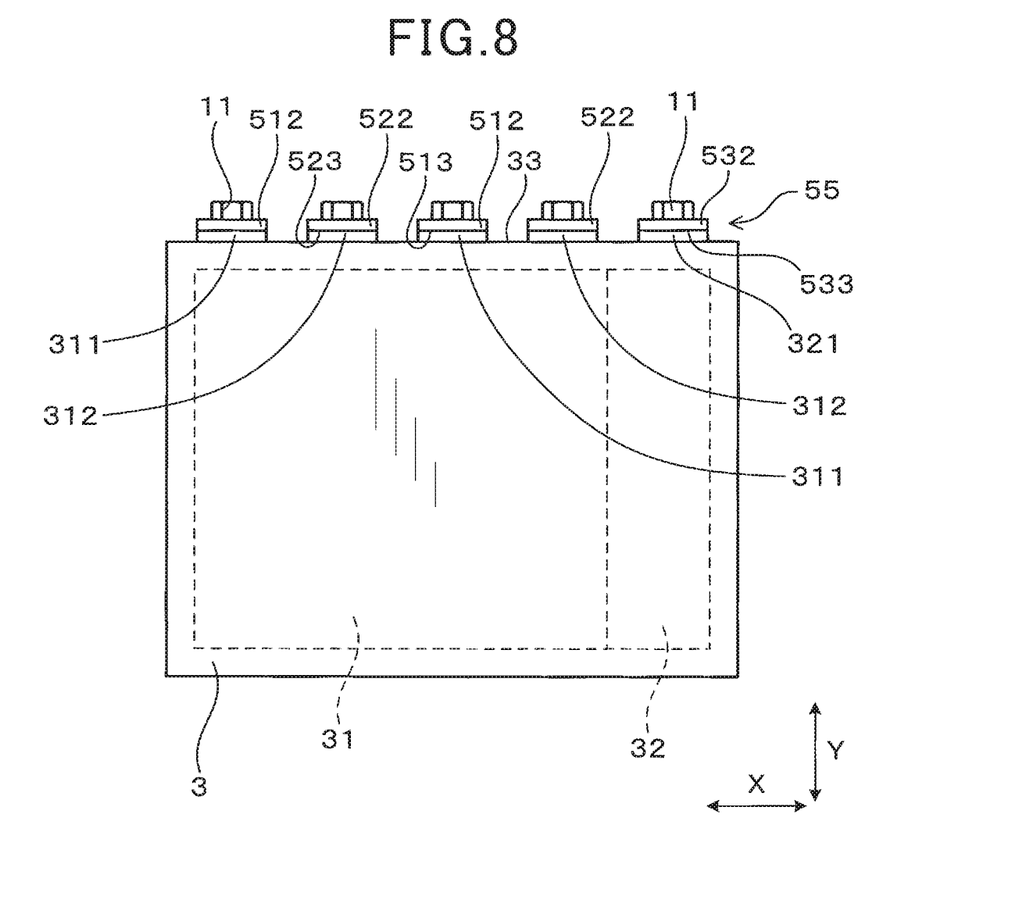
FIG. 8 is a plan view which illustrates a capacitor assembly to which a terminal array is connected in the first embodiment.

The smoothing capacitor 31 and the filter capacitor 32 are, as illustrated in FIGS. 2 and 8, assembled together in the form of the capacitor assembly 3.

The circuit diagram of FIG. 2 illustrates the semiconductor modules 2, the capacitor assembly 3, the reactor 4, and the bus bar assembly 5 as enclosed by broken lines with reference numbers.

The capacitor assembly 3, as illustrated in FIG. 8, has mounted thereon the terminals 311 and 312 electrically connected to the high-voltage electrode and the low-voltage electrode of the smoothing capacitor 31 and the terminal 321 electrically connected to the positive electrode of the filter capacitor 32. The terminals 311, 312, and 321 are respectively connected to the capacitor-side high-voltage terminals 512, the capacitor-side low-voltage terminals 522, and the capacitor-side relay terminal 532 of the bus bar assembly 5.

In the electrical power conversion device 1, the capacitor assembly 3, the semiconductor modules 2, and the reactor 4 are, as clearly illustrated in FIG. 1, arranged on opposite sides of the bus bar assembly 5 in the major surface-of-body facing direction Z. The semiconductor modules 2 and the reactor 4 are stacked on each other in the array direction X. The cooler 12 is also stacked on the stack of the semiconductor modules 2 and the reactor 4.

The capacitor assembly 3, as clearly illustrated in FIGS. 1 and 8, has the rear surface 33 and the terminals 311, 312, and 321 exposed outside the rear surface 33. The terminals 311, 312, and 321 are aligned with each other in the array direction X. The terminals 311, 312, and 321 are disposed at an interval (i.e., a pitch) away from each other which is identical with that at which the capacitor-side high-voltage terminals 512, the capacitor-side low-voltage terminals 522, the capacitor-side relay terminal 532 are, as illustrated in FIGS. 6 and 7, arranged away from each other.

The two terminals 311 electrically connected to the high-voltage side of the smoothing capacitor 31 and the two terminals 312 electrically connected to the low-voltage side of the smoothing capacitor 31 are arranged alternately in the array direction X. The terminal 321 electrically connected to the filter capacitor 32 is located next to the end of the array of the terminals 311 and 312 in the array direction X.

The capacitor-side high-voltage terminals 512, the capacitor-side low-voltage terminals 522, and the capacitor-side relay terminal 532 of the bus bar assembly 5 are, as illustrated in FIGS. 1 and 8, electrically connected to the terminals 311, 312, and 321, respectively. Specifically, the capacitor-side high-voltage terminals 512, the capacitor-side low-voltage terminals 522, and the capacitor-side relay terminal 532 are joined to the terminals 311, 312, and 321 using the bolts 11.

The terminal contact surfaces 513, 523, and 533 of the capacitor-side high-voltage terminals 512, the capacitor-side low-voltage terminals 522, and the capacitor-side relay terminal 532 are placed in surface-contact with the terminals 311, 312, and 321 of the capacitor assembly 3. The capacitor-side high-voltage terminals 512, the capacitor-side low-voltage terminals 522, and the capacitor-side relay terminal 532 have formed therein holes 552 through which the bolts 11 pass.

Beneficial advantages, as offered by the above embodiment, will be described below.

The electrical power conversion device 1 is, as described above, designed to have the high-voltage bus bar 51, the low-voltage bus bar 52, and the relay bus bar 53 which are integrated together in the form of the bus bar assembly 5. This enables the high-voltage bus bar 51, the low-voltage bus bar 52, and the relay bus bar 53 to be handled as a single unit in an assembling process of the electrical power conversion device 1, thereby facilitating the ease with which the electrical power conversion device 1 is fabricated.

Since the high-voltage bus bar 51, the low-voltage bus bar 52, and the relay bus bar 53 are fabricated as the bus bar assembly 5, it is possible to ensure electrical insulation between the bus bars 51, 52, and 53 and also to place them close to each other. This facilitates the down-sizing of the electrical power conversion device 1.

The capacitor-side high-voltage terminals 512, the capacitor-side low-voltage terminals 522, and the capacitor-side relay terminal 532 are all oriented to have the terminal contact surfaces 513, 523, and 533 facing in the same direction and also arranged in line in the array direction X. This facilitates electrical connection of the bus bar assembly 5 with the smoothing capacitor 31 and the filter capacitor 32, thus resulting in ease of assembling of the electrical power conversion device 1.

The capacitor-side high-voltage terminals 512 and the capacitor-side low-voltage terminals 522 of the terminal array 55 are alternately arranged in line. In other words, each of the capacitor-side low-voltage terminals 522 is disposed between the adjacent capacitor-side high-voltage terminals 512. This decreases the inductance of electrical current paths in the high-voltage bus bar 51 and the low-voltage bus bar 52. Specifically, electrical currents i, as demonstrated in FIG. 9, flow through each of the capacitor-side high-voltage terminals 512 and each of the capacitor-side low-voltage terminals 522 in opposite directions. The alternate arrangement of the capacitor-side high-voltage terminals 512 and the capacitor-side low-voltage terminals 522, thus, results in a decrease in inductance of the electrical current paths.

Figure 9:
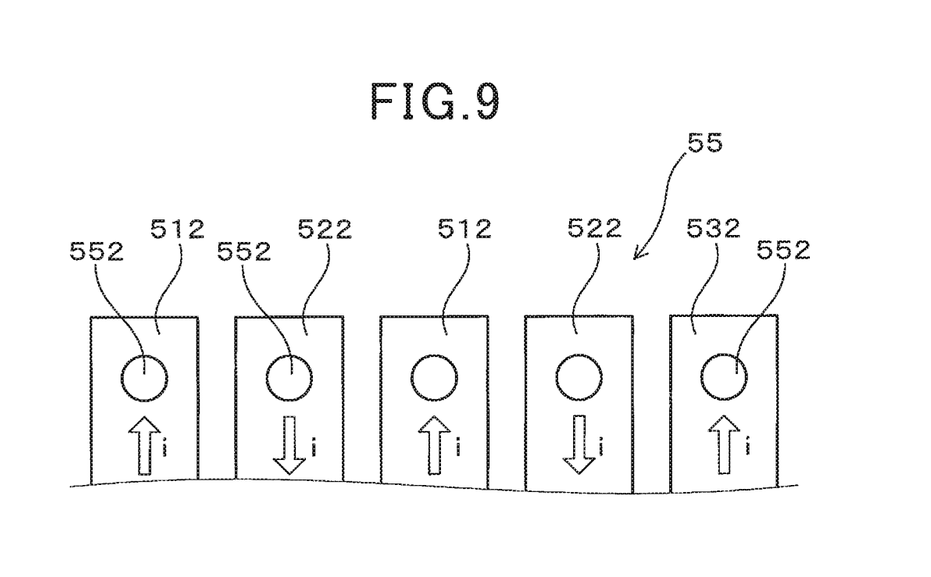
FIG. 9 is an explanatory view which demonstrates a reduction in inductance of a terminal array in the first embodiment.

The capacitor-side relay terminal 532 of the terminal array 55 is arranged adjacent to one of the capacitor-side low-voltage terminals 522. The electrical current i flows through the capacitor-side relay terminal 532 in a direction opposite a direction in which the electrical current i flows through the capacitor-side low-voltage terminals 522. This also results in a decrease in the inductance.

The major surfaces of the high-voltage body 510, the low-voltage body 520, and the relay body 530 are all oriented to face in the same direction (i.e., the major surface-of-body facing direction Z), thereby facilitating the ease with which a sealed portion of the bus bar assembly 5 formed by the insulator 54 is shaped to be thin or reduced in size thereof. This results in a decrease in space required for installation of the bus bar assembly 5, thus facilitating the downsizing of the electrical power conversion device 1.

The high-voltage body 510 and the low-voltage body 520 are disposed on each other through an interval therebetween in the major surface-of-body facing direction Z to form the layer stack 56. This results in a further reduction in size of the bus bar assembly 5 and a decrease in the inductance.

The relay body 530 is located away from the layer stack 56 in the stacking direction X. In other words, the relay body 530 does not overlap the layer stack 56 in the major surface-of-body facing direction Z. This facilitates the arrangement of the reactor 4 and the filter capacitor 32 connected to the relay bus bar 53.

The terminal contact surfaces 513, 523, and 533 of the terminal array 55 are all oriented to have the normal lines crossing the major surface-of-body facing direction Z. This also facilitates connections of the terminals of the terminal array 55 with the terminals 311, 312, and 321 of the capacitor assembly 3.

In other words, the combination of the high-voltage body 510, the low-voltage body 520, and the relay body 530 (i.e., the bus bar assembly 5) is, as can be seen in FIG. 1, disposed in space between the capacitor assembly 3 and a combination of the semiconductor modules 2 and the reactor 4. Therefore, if the normal lines of the terminal contact surfaces 513, 523, and 533 of the terminals of the terminal array 55 extend parallel to the major surface-of-body facing direction Z, it results in a difficulty in connecting the terminals of the terminal array 55 with the terminals 311, 312, and 321 of the capacitor assembly 3 because the semiconductor modules 2, the reactor 4, or the cooler 12 is disposed to cover the terminal array 44 in the major surface-of-body facing direction Z, that is, they interfere with an operation to connect the terminals of the terminal array 55 with the terminals 311, 312, and 321 of the capacitor assembly 3.

In order to alleviate the above problem, the terminal contact surfaces 513, 523, and 533 are oriented to have the normal lines thereof traversing (e.g., perpendicular to) the major surface-of-body facing direction Z, so that a direction in which fastens (e.g., the bolts 11) to join the capacitor-side high-voltage terminals 512, the capacitor-side low-voltage terminals 522, and the capacitor-side relay terminal 532 to the terminals 311, 312, and 321 are inserted into the holes 552 is different from the major surface-of-body facing direction Z. This avoids physical interference of the semiconductor modules 2, the reactor 4, or the cooler 12 with the fastener (e.g., the bolts 11) or tools, thereby facilitating the connection of the capacitor-side high-voltage terminals 512, the capacitor-side low-voltage terminals 522, and the capacitor-side relay terminal 532 to the terminals 311, 312, and 321.

The relay body 530 is, as described above with reference to FIG. 5, arranged between the extended lines of the major surfaces 561 and 562 of the layer stack 56 in the major surface-of-body facing direction Z, thereby enabling the insulator 54 of the bus bar assembly 5 to have a decreased thickness, which results in a reduction in size of the bus bar assembly 5, thus leading to the downsizing of the electrical power conversion device 1.

When viewed in the major surface-of-body facing direction Z, the capacitor-side high-voltage terminals 512, the capacitor-side low-voltage terminals 522, and the capacitor-side relay terminal 532 of the terminal array 55 are, as described above, aligned with each other in the array direction X, thereby resulting in a decrease in inductance of the terminal array 55, and facilitating decreasing of a dimension of the bus bar assembly 5 in the longitudinal direction Y.

The two attachment portions 57 of the bus bar assembly 5 are located on opposite sides of the terminal array 55 in the array direction X. This ensures the accurate positioning between the terminals of the capacitor assembly 3 and the terminals of the terminal array 55 and improves the vibration resistance of the terminal array 55 to enhance the durability of the terminal connections thereof.

The electrical power conversion device 1 is, as apparent from the above discussion, capable of reducing the inductance and facilitating the assembling and downsizing thereof.

Second Embodiment

Figure 10:
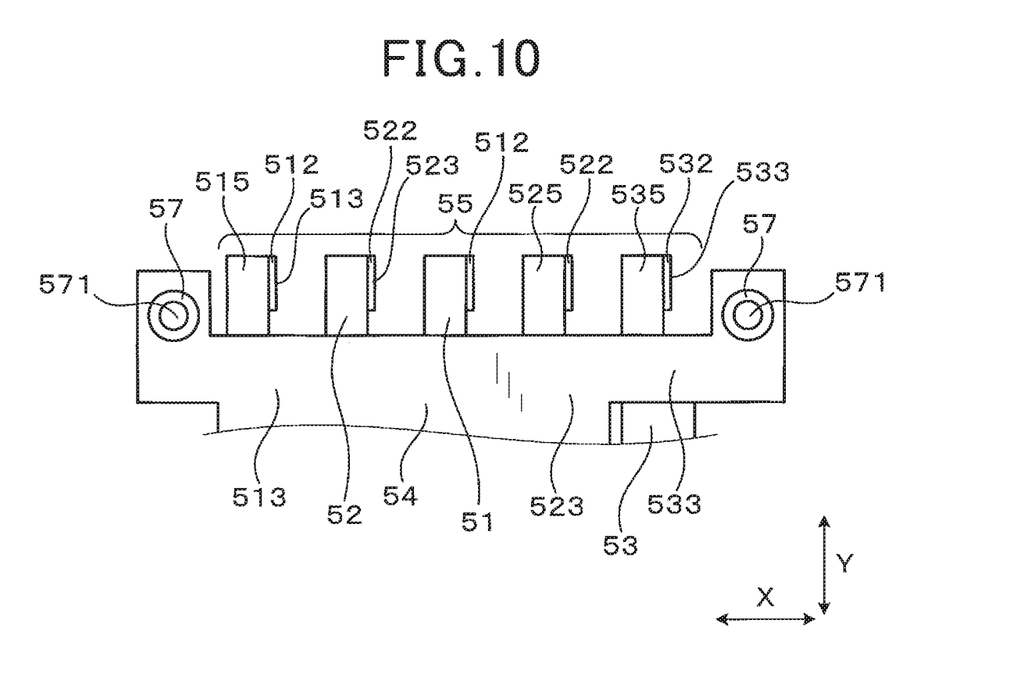
FIG. 10 is a plan view which illustrates a portion of a bus bar assembly including a terminal array according to the second embodiment.
Figure 11:
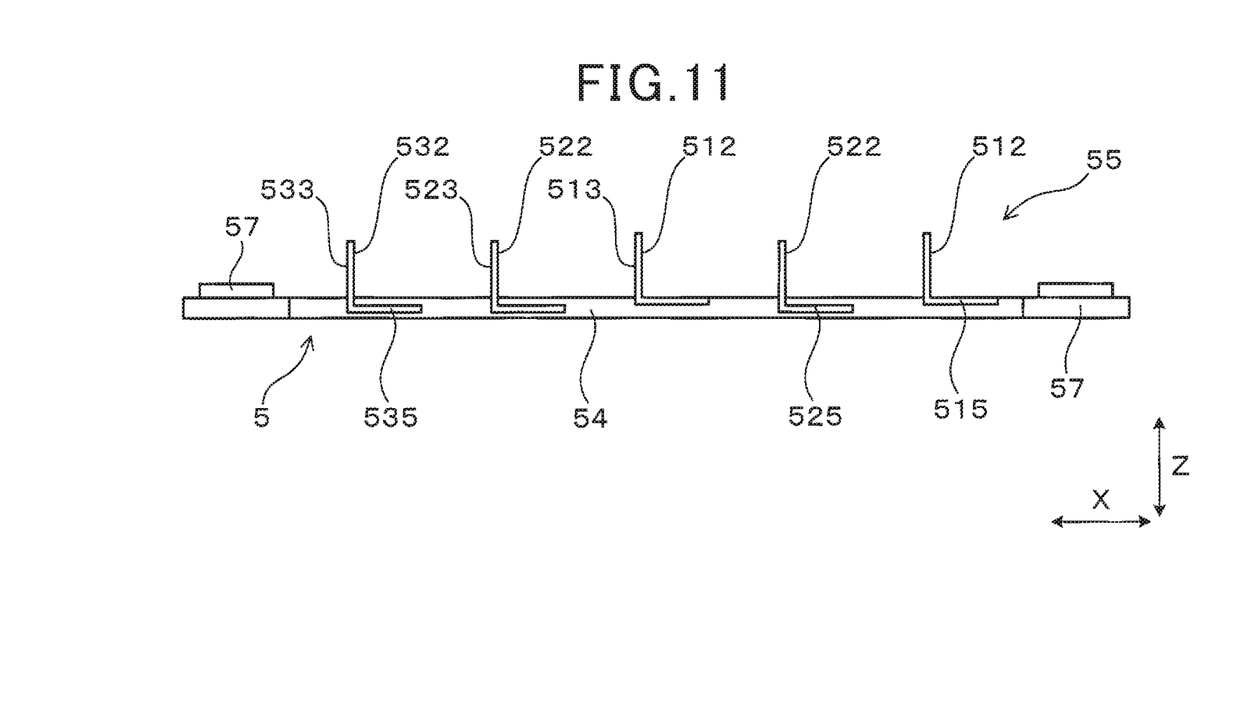
FIG. 11 is a back view which illustrates a bus bar assembly in the second embodiment.

FIGS. 10 and 11 show the second embodiment of the electrical power conversion device 1. The capacitor-side high-voltage terminals 512, the capacitor-side low-voltage terminals 522, and the capacitor-side relay terminal 532 are oriented to have the terminal contact surfaces 513, 523, and 533 each of which faces in the array direction X, in other words, extends in a direction perpendicular to the array direction X. Specifically, the capacitor-side high-voltage terminals 512, the capacitor-side low-voltage terminals 522, and the capacitor-side relay terminal 532 are arranged to have lines normal thereto which extend in the array direction X.

The high-voltage bus bar 51, as illustrated in FIG. 10, has a plurality of rearward extensions 515 which extend from the high-voltage body 510 rearward in the longitudinal direction Y. The capacitor-side high-voltage terminals 512, as can be seen in FIG. 11, protrude from the rearward extensions 515 in the major surface-of-body facing direction Z.

Similarly, the low-voltage bus bar 52, as shown in FIG. 10, has the rearward extensions 525 extending from the low-voltage body 520 rearward in the longitudinal direction Y. Each of the rearward extensions 525, as can be seen in FIG. 11, has the capacitor-side low-voltage terminal 522 extending in the major surface-of-body facing direction Z.

The relay bus bar 53, as illustrated in FIG. 10, has the rearward extension 535 extending from the relay body 530 in the longitudinal direction Y. The rearward extension 535, as clearly illustrated in FIG. 11, has the capacitor-side relay terminal 532 protruding from the rearward extension 535 in the major surface-of-body facing direction Z.

The terminals protruding from the capacitor assembly 3 are placed to contact the capacitor-side high-voltage terminals 512, the capacitor-side low-voltage terminals 522, and the capacitor-side relay terminal 532 of the bus bar assembly 5 in the array direction X.

Other arrangements of the electrical power conversion device 1 are identical with those in the first embodiment, and explanation thereof in detail will be omitted here.

The electrical power conversion device 1 of this embodiment is, like in the first embodiment, capable of reducing the inductance and facilitating the assembling and downsizing thereof.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

In each of the above embodiments, the high-voltage bus bar 51 has the two capacitor-side high-voltage terminals 512. The low-voltage bus bar 52 has the two capacitor-side low-voltage terminals 522. However, the high-voltage bus bar 51 may be designed to have three or more capacitor-side high-voltage terminals 512. Similarly, the low-voltage bus bar 52 may have three or more capacitor-side low-voltage terminals 522. Alternatively, the high-voltage bus bar 51 may have a single capacitor-side high-voltage terminal 512. Similarly, the low-voltage bus bar 52 may have a single capacitor-side low-voltage terminal 522. Either of the high-voltage bus bar 51 or the low-voltage bus bar 52 may have a single capacitor-side high-voltage terminal 512 or a single capacitor-side low-voltage terminal 522, while the other may have two capacitor-side high-voltage terminals 512 or two capacitor-side low-voltage terminals 522.

The number of the capacitor-side high-voltage terminals 512 may be different from that of the capacitor-side low-voltage terminals 522. It is advisable in such a case that a difference in number between the capacitor-side high-voltage terminals 512 and the capacitor-side low-voltage terminals 522 be one, and that the number of the capacitor-side low-voltage terminals 522 be greater than that of the capacitor-side high-voltage terminals 512 by one because it is easy to place the capacitor-side relay terminal 532 next to an outermost one of the capacitor-side low-voltage terminals 522 located in the array direction X.

What is claimed is:

1. An electrical power conversion apparatus comprising:
a semiconductor module in which semiconductor devices are installed;
a smoothing capacitor, a filter capacitor, and a reactor which are electrically connected to the semiconductor module;
a high-voltage bus bar which connects the semiconductor module and a high-voltage electrode of the smoothing capacitor;
a low-voltage bus bar which connects the semiconductor module and a low-voltage electrode of the smoothing capacitor; and
a relay bus bar which connects the filter capacitor and the reactor,
wherein the high-voltage bus bar, the low-voltage bus bar, and the relay bus bar are electrically isolated from each other and integrated together in a form of a bus bar assembly,
wherein the high-voltage bus bar is equipped with a semiconductor-side high-voltage terminal connected to the semiconductor module and a capacitor-side high-voltage terminal connected to the smoothing capacitor,
wherein the low-voltage bus bar is equipped with a semiconductor-side low-voltage terminal connected to the semiconductor module and a capacitor-side low-voltage terminal connected to the smoothing capacitor,
wherein the relay bus bar is equipped with a reactor-side relay terminal connected to the reactor and a capacitor-side relay terminal connected to the filter capacitor,
wherein the capacitor-side high-voltage terminal, the capacitor-side low-voltage terminal, and the capacitor-side relay terminal are aligned with each other in an array direction in a form of a terminal array, and
wherein the capacitor-side high-voltage terminal and the capacitor-side low-voltage terminal of the terminal array are arranged adjacent each other, and the capacitor-side relay terminal is located at an end of the terminal array.

2. The electrical power conversion apparatus as set forth in claim 1, wherein the high-voltage bus bar has a high-voltage body disposed between the semiconductor-side high-voltage terminal and the capacitor-side high-voltage terminal, wherein the low-voltage bus bar has a low-voltage body disposed between the semiconductor-side low-voltage terminal and the capacitor-side low-voltage terminal, wherein the relay bus bar has a relay body disposed between the reactor-side relay terminal and the capacitor-side relay terminal, and wherein a major surface of the high-voltage body, a major surface of the low-voltage body, and a major surface of the relay body are oriented to face in a same direction that is a major surface-of-body facing direction.

3. The electrical power conversion apparatus as set forth in claim 2, wherein the capacitor-side high-voltage terminal, the capacitor-side low-voltage terminal, and the capacitor-side relay terminal have terminal contact surfaces which are connected to mating parts and face in a same direction.

4. The electrical power conversion apparatus as set forth in claim 3, wherein the array direction is a direction along the terminal contact surfaces.

5. The electrical power conversion apparatus as set forth in claim 4, wherein the terminal contact surfaces of the capacitor-side high-voltage terminal, the capacitor-side low-voltage terminal, and the capacitor-side relay terminal of the terminal array are oriented to have normal lines thereof which cross the major surface-of-body facing direction.

6. The electrical power conversion apparatus as set forth in claim 3, wherein when viewed in a direction perpendicular both to a normal direction of the terminal contact surfaces of the terminal array and to the array direction, the capacitor-side high-voltage terminal, the capacitor-side low-voltage terminal, and the capacitor-side relay terminal are all aligned with each other in the array direction.

7. The electrical power conversion apparatus as set forth in claim 2, wherein the high-voltage body and the low-voltage body are disposed on each other through an interval therebetween in the major surface-of-body facing direction to form a layer stack, and wherein the relay body is located out of overlap with the layer stack in the major surface-of-body facing direction.

8. The electrical power conversion apparatus as set forth in claim 7, wherein the relay body is disposed between extended lines of major surfaces of the layer stack in the major surface-of-body facing direction.

9. The electrical power conversion apparatus as set forth in claim 1, wherein the capacitor-side relay terminal is disposed adjacent the capacitor-side low-voltage terminal in the terminal array.

10. The electrical power conversion apparatus as set forth in claim 1, wherein the high-voltage bus bar is equipped with a plurality of capacitor-side high-voltage terminals, and the low-voltage bus bar is equipped with a plurality of capacitor-side low-voltage terminals, and wherein the capacitor-side high-voltage terminals and the capacitor-side low-voltage terminals are arranged alternately in the terminal array.

11. The electrical power conversion apparatus as set forth in claim 1, wherein the bus bar assembly has at least two attachment portions joined to a casing of the electrical power conversion apparatus, and wherein the attachment portions are located on opposite sides of the terminal array in the array direction.

* * * * *